United States Patent
Huang et al.

(10) Patent No.: US 8,378,756 B2
(45) Date of Patent: Feb. 19, 2013

(54) DRIVE LOOP FOR MEMS OSCILLATOR

(75) Inventors: Ming-Chieh Huang, San Jose, CA (US);
Chiang Pu, San Jose, CA (US);
Chan-Hong Chern, Palo Alto, CA (US);
Chih-Chang Lin, San Jose, CA (US);
Yuwen Swei, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 181 days.

(21) Appl. No.: 12/782,064

(22) Filed: May 18, 2010

(65) Prior Publication Data
US 2011/0285445 A1    Nov. 24, 2011

(51) Int. Cl.
*H03B 5/30*    (2006.01)
*G01C 19/00*    (2006.01)

(52) U.S. Cl. ............... 331/154; 331/183; 73/504.12

(58) Field of Classification Search ............ 73/488, 73/503, 503.3, 504.02, 504.03, 504.04, 504.12; 331/116 R, 116 M, 109, 154, 156, 182, 183, 331/185
See application file for complete search history.

(56) References Cited

U.S. PATENT DOCUMENTS

| | | | |
|---|---|---|---|
| 6,526,826 B2 * | 3/2003 | Kurachi et al. | 73/504.02 |
| 8,004,354 B1 * | 8/2011 | Pu et al. | 330/86 |
| 2008/0083969 A1 * | 4/2008 | Osada | 257/595 |
| 2009/0217757 A1 * | 9/2009 | Nozawa | 73/504.12 |
| 2010/0126271 A1 * | 5/2010 | Inukai et al. | 73/504.12 |

* cited by examiner

*Primary Examiner* — Ryan Johnson
(74) *Attorney, Agent, or Firm* — Lowe Hauptman Ham & Berner, LLP

(57) ABSTRACT

Some embodiments regard a method comprising: generating a current according to a movement of the MEMS device; the movement is controlled by a control signal; generating a peak voltage according to the current; and adjusting the control signal when the peak voltage is out of a predetermined range.

19 Claims, 7 Drawing Sheets

DRIVE LOOP FOR MEMS OSCILLATOR

FIELD

The present disclosure is related to a microelectromechanical structure (MEMS).

BACKGROUND

Microelectromechanical (MEMS) devices are commonly used in many applications, including for example, the MEMS gyroscope ("gyro"), the MEMS oscillator, etc. Oscillation in the MEMS applications, however, is subject to large manufacturing process, voltage, and temperature (PVT) variations. The quality factor Q in the MEMS, which is defined as the ratio of the energy stored in the resonator to the energy lost in one cycle, also varies. As a result, when a fixed voltage is applied to different MEMS devices, the responses of the different MEMS devices vary (e.g., one device moves a longer distance than another device). Further, the charge pump that provides the high voltage (e.g., 15-20 V) to the MEMS in many approaches generates a high voltage without considering the voltage demand from the MEMS, and, as a result, consumes high (e.g., extra) power. Consequently, there is a need to improve the above deficiencies of MEMS and their related applications.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
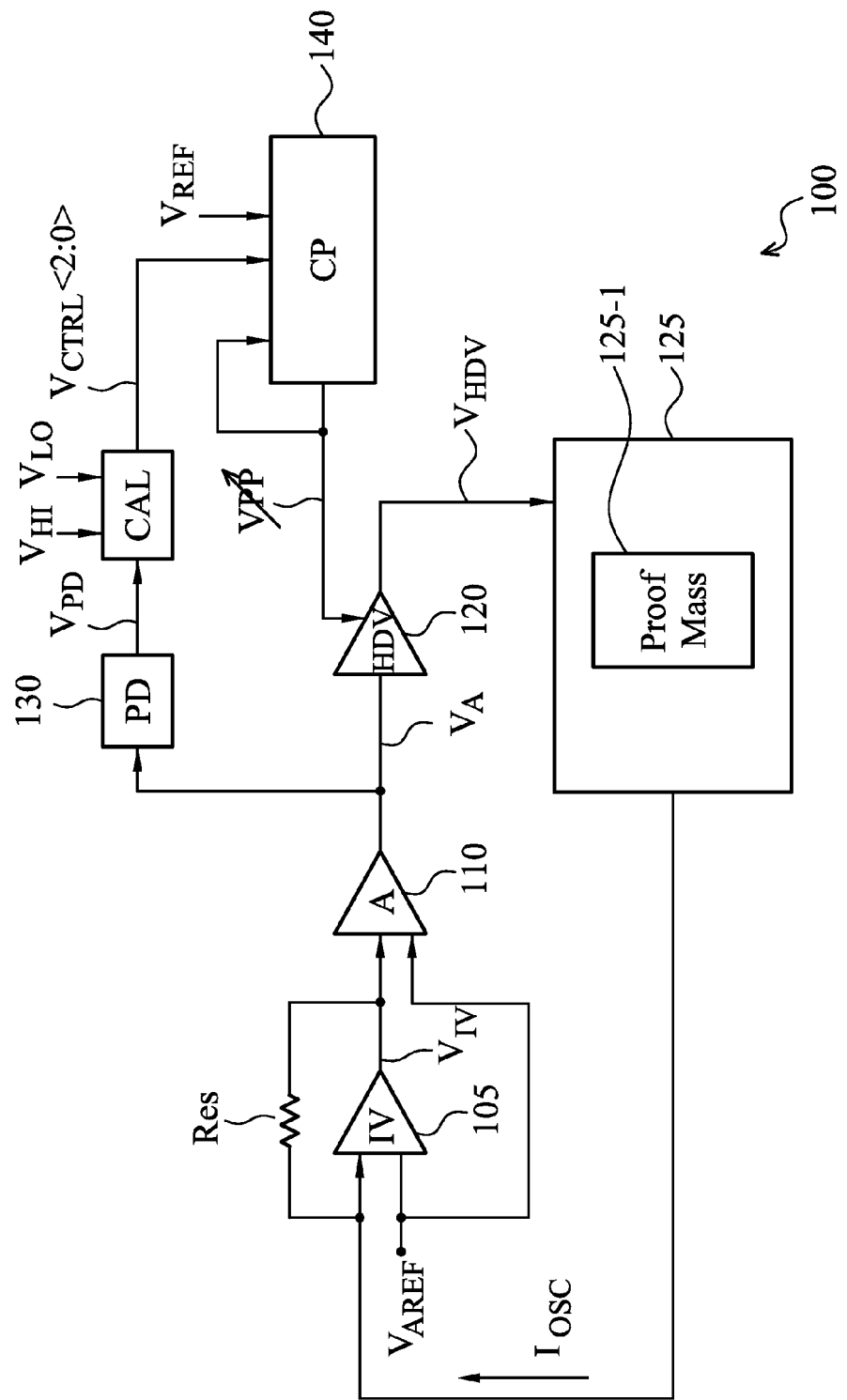
FIG. 1 is a functional block diagram of a MEMS circuit, in accordance with some embodiments.

Embodiments, or examples, illustrated in the drawings are now being disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following advantages. Some embodiments consume less power than other approaches because the voltage (e.g., power) for use in a MEMS oscillator is controlled based on the movement distance of the mechanical parts. Further, because of the controlled voltage, the movement distance variations of the mechanical parts due to the PVT and Q factor variations are, in effect, eliminated.

Exemplary Circuit

FIG. 1 is a diagram of an illustrative functional block diagram 100 in accordance with some embodiments.

Generally, when MEMS oscillator 125 is moved and/or rotated, current Iosc is created and includes an alternating current (AC) component. In various embodiments, current Iosc oscillates in the range of 15 KHz, its amplitude expands a wide range from 0.2 nA to 2 µA, and the disclosed embodiments respond to this wide range.

IV amplifier 105 performs the I-to-V conversion, e.g., converting current Iosc to voltage $V_{IV}$, which comprises a direct current (DC) voltage (e.g., from the common mode voltage) plus an AC component. If current Iosc does not include an AC component, voltage $V_{IV}$ functions in the DC level of the common mode voltage of amplifier 105. Typically, voltage $V_{IV}$ oscillates at the same frequency as current Iosc, which, in various embodiments, is at about 15 KHz. Amplifier 105 can be called a transimpedance amplifier.

Voltage $V_{IV}$ also serves as an input to amplifier 110. Generally, the amplitude of voltage $V_{IV}$ results from Iosc*Res, or, in another word, voltage $V_{IV}$ equals the common mode voltage of amplifier 105 (e.g., Vcm) plus an AC component resulting from the AC component of current Iosc. For example, if Vcm=1.65V, then $V_{IV}$=1.65V±Iosc*Res, where Iosc, in some embodiments, is a sinusoidal current signal.

In some embodiments, voltage $V_{IV}$ is too small and not sufficient for a particular application. As a result, amplifier 110 amplifies voltage $V_{IV}$ and generates voltage $V_A$ having the appropriate desired level. Amplifier 110 receives voltage $V_{IV}$ as an input, and amplifies voltage $V_{IV}$ to generate voltage $V_A$, which, in some embodiments, is sinusoidal. Voltage $V_{AREF}$ serves as a reference voltage for amplifiers 105 and 110.

Voltage peak detector (PD) 130 detects the voltage peak of voltage $V_A$ and generates signal $V_{PD}$ for use by calibrator (CAL) 135.

Calibrator 135, based on signal $V_{PD}$ that reflects the peak of voltage $V_A$ and two reference voltages $V_{LO}$ and $V_{HI}$, generates signal $V_{CTRL}$, to control charge pump regulator 140. If voltage $V_{PD}$ is in between voltages $V_{LO}$ and $V_{HI}$ (e.g., higher than voltage $V_{LO}$ and lower than voltage $V_{HI}$) then signal $V_{CTRL}$ is generated such that charge pump CP remains in the same state in its state machine (e.g., state machine 320 in FIG. 3), maintaining the same voltage VPP. But if voltage $V_{PD}$ is lower than voltage $V_{LO}$ then signal $V_{CTRL}$ is generated such that charge pump CP changes its state machine towards a higher voltage VPP (e.g., from state 000 to state 001). Similarly, if voltage $V_{PD}$ is higher than voltage $V_{HI}$ then signal $V_{CTRL}$ is generated such charge pump CP changes its state machine towards a lower voltage VPP (e.g., from state 001 to state 000). In some embodiments, voltage $V_{CTRL}$ includes 3 bits (e.g., $V_{CTRL}$<2:0>) decoded to 8 digital values that correspond to 8 states of state machine 320. The embodiments, however, are not limited to such a number of 3 bits. Different numbers of bits corresponding to different digital values are within the scope of the embodiments. Further, voltages $V_{HI}$ and $V_{LO}$ are selected based on various factors related to the properties of MEMS oscillator 125, proof mass 125-1 of the MEMS oscillator 125, etc. Those factors include, for example, the weight or the mass of proof mass 125-1, or the distance predetermined for the proof mass 125-1 to move. Based on those properties, the corresponding current Iosc and voltages $V_{IV}$, $V_A$, $V_{PD}$ are calculated. For example, a moving distance of 10 μm corresponds to a voltage $V_{PD}$ at about 2.2V (through the calculations of Ios, $V_{IV}$, $V_A$). Voltages $V_{HI}$ and $V_{LO}$ are set accordingly, by, for example, 2.5V and 2.0V, respectively.

Charge pump regulator (CP) 140 provides the voltage VPP demanded by high voltage driver (HDV) 120 based on a state provided by signal $V_{CTRL}$ and a corresponding reference voltage generated from voltage $V_{REF}$. In some embodiments, a digital value of signal $V_{CTRL}$ corresponds to a state of the state machine and also corresponds to a reference voltage (e.g., $V_{REF1}$, $V_{REF2}$, $V_{REF3}$, etc., generated from voltage $V_{REF}$). CP 140, based on the feedback signal VPP against the corresponding reference voltage for a particular state, decides to continue pumping (increasing) voltage VPP or not. For example, at the beginning of a default state while voltage VPP has not reached $V_{REF1}$ at 4V, CP 140 continues to pump (e.g., to increase) voltage VPP until voltage VPP reaches 4V when CP 140 stops pumping.

Voltage VPP generated by CP 140 is used as the operation voltage for HDV 120. In some embodiments, the smaller the voltage VPP, the shorter distance proof mass 125-1 moves. In contrast, the higher the voltage VPP, the larger distance proof mass 125-1 moves. For example, based on the peak of voltage $V_A$, CP 140 increases the pumped voltage VPP, if the peak is low, i.e., reflecting a small current Iosc or slow movement of proof mass 125-1. At some particular voltage VPP that maintains the constant speed of proof mass 125-1, CP 140 stops pumping, but provides the constant voltage VPP. In some embodiments, a charge pump that can provide a desired voltage range (e.g., 15-20 V) is selected as CP 140. In some embodiments, voltage $V_{HDV}$ is a little lower than voltage VPP, but, for illustration, voltage VPP and voltage $V_{HDV}$ are considered to be the same.

High voltage driver 120 provides the high voltage (e.g., voltage $V_{HDV}$) demanded by MEMS oscillator 125. In some embodiments, driver 120 is an amplifier having a variable gain and amplifying voltage $V_A$ to generate voltage $V_{HDV}$. Further, the gain of driver 120 is large compared to the gain of amplifier 110 (e.g., 100 for HDV 120 versus 5 or 6 for amplifier 110). In some embodiments, high voltage driver 120 (versus a conventional amplifier) is used to provide the high voltage demanded by MEMS oscillator 125. Driver 120 also receives voltage VPP as its operation voltage. The higher voltage VPP driver 120 receives, the higher voltage $V_{HDV}$ driver 120 generates, and the larger distance proof mass 125-1 moves. In some embodiments, there is a voltage drop from voltage VPP to voltage $V_{HDV}$ through a voltage regulator (not shown), and this voltage drop is considered in generating voltage VPP. The waveform for voltage $V_{HDV}$ when drawn is similar to that of voltage VPP except for the voltage drop.

Proof mass 125-1 is the moving part of MEMS oscillator 125. In some embodiments, proof mass 125-1, when first being moved, moves slowly, then gains additional speed to move faster and up to a point where proof mass 125-1 remains at a constant speed. In some occasions, a proof mass 125-1 in one MEMS oscillator 125 moves more easily than another proof mass 125-1 in another MEMS oscillator 125 (e.g., in a different semiconductor device). As a result, different proof masses 125-1 demand different voltages for them to move, even though they are of the same mass. In some embodiments, voltage VPP is provided based on the demand speed/moving distance of proof mass 125-1. That is, voltage VPP is controlled and provided sufficient for a proof mass 125-1 to move, which is advantageous over other approaches where the voltage is provided without regards to the speed or moving distance of proof mass 125-1. As a result, some embodiments save power because the power is not wasted like other approaches where excessive voltage (and thus power) is generated. The movement of a proof mass 125-1 corresponds to the amplitude of the corresponding current Iosc.

In some embodiments, a proof mass 125-1 is moved according to a differential signal that cancels the noise in moving proof mass 125-1. For example, a voltage is applied on one side of proof mass 125-1 while the other side of proof mass 125-1 collects the charge from which current Iosc is created. In some embodiments, a proof mass 125-1 moves in the range of 1 μm to 10 μm.

Figure 2:
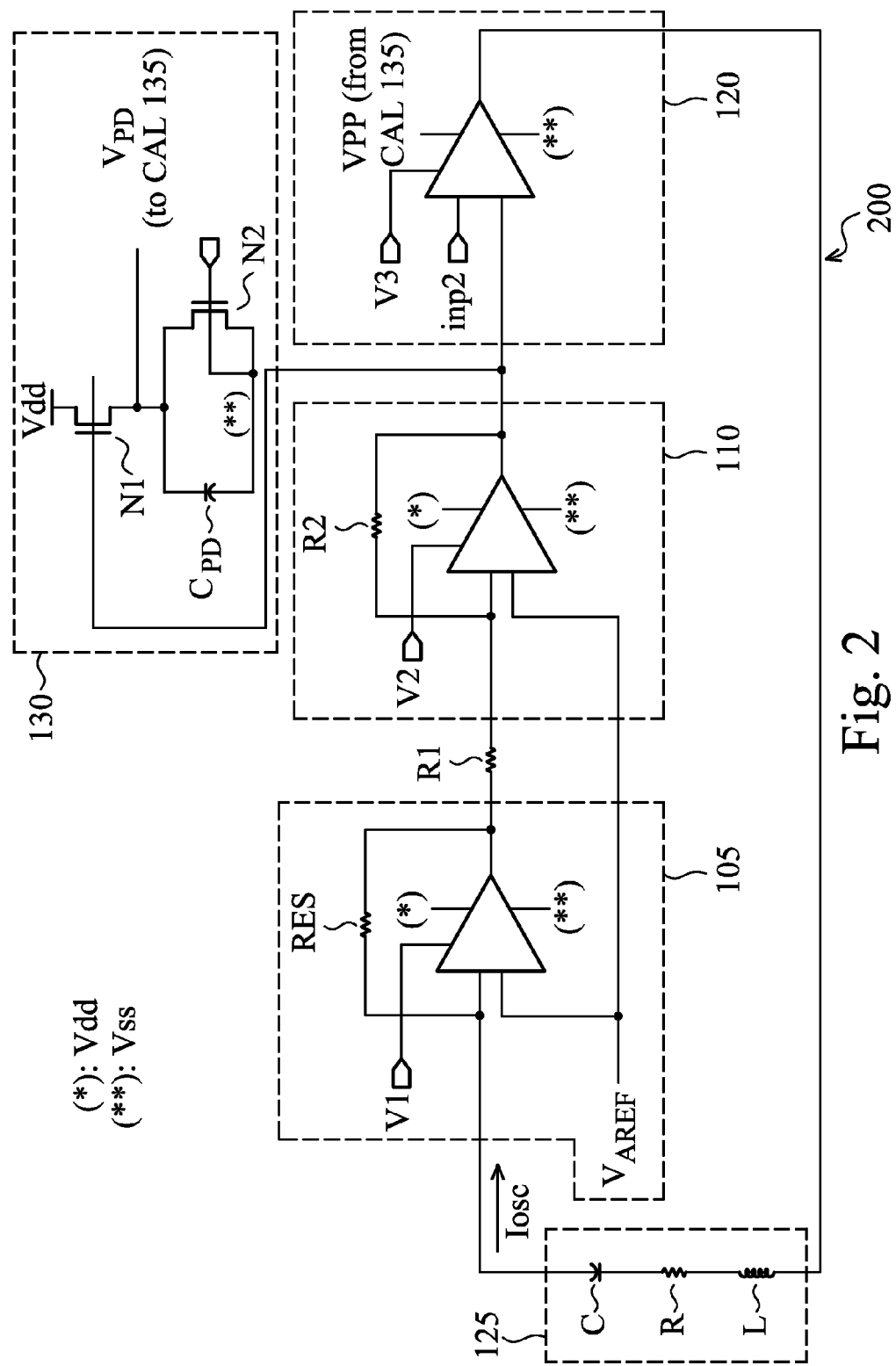
FIG. 2 is a detailed schematic diagram of the MEMS circuit in FIG. 1, in accordance with some embodiments.

FIG. 2 is a diagram of a circuit 200 of block diagram 100, in accordance with some embodiments. Compared to FIG. 1, and for simplicity, calibrator 135 and CP 140 are not shown in FIG. 2. Voltage Vdd is the operation voltage and Vss is ground. Voltages V1, V2, and V3 provide the bias voltages for the respective amplifiers 105, 110, and 120. Resistors R1 and R2 serve to provide the gain for amplifier 110. Voltage $V_{AREF}$ serves as a reference voltage for amplifiers 105 and 110. In some embodiments, voltage $V_{AREF}$ is about ½ Vdd (e.g., 1.65 V where Vdd is 3.3 V). Amplifiers 105, 110, and 120 amplify respective currents/voltages.

MEMS oscillator 125 in FIG. 1 is denoted by an equivalent series LRC circuit (e.g., circuit 125). Current Iosc oscillates at the same frequency as that of the LRC circuit 125.

Capacitor $C_{PD}$ and transistors N1 and N2 of peak detector 130 detect the peak of voltage $V_A$ and generate voltage $V_{PD}$. In some embodiments, voltage $V_A$ drives the gate of transistor N1. The source of transistor N1 is coupled to a first end of capacitor $C_{PD}$ and the drain of transistor N2. The second end of capacitor $C_{PD}$ is coupled to the source and the bulk of transistor N2 (which, in some embodiments, is VSS or ground), and the gate of transistor N2 is coupled to a voltage reference Vrn2. Further, transistor N1 functions as a source follower in which the voltage at the source (e.g., $V_{PD}$) follows the voltage at the gate (e.g., $V_A$) subject to the voltage $V_{GSN1}$ drop where voltage $V_{GSN1}$ is the voltage drop across the gate and the source of transistor N1. Transistor N2 provides a current path for voltage $V_{PD}$, and capacitor $C_{PD}$ acts as a low pass filter for voltage $V_A$.

Mathematically, $V_{PD}=V_A-V_{GSN1}$. In some embodiments, voltage $V_A$ and voltage $V_{PD}$ oscillate at two different frequencies, e.g., frequency f1 and frequency f2. Capacitor $C_{PD}$ is configured such that frequency f2 is lower than frequency f1, and, in some embodiments, is set at 2.8 pF through simulation. In other words, $C_{PD}$ is configured to function as a low-pass filter that removes higher frequency components from voltage $V_{PD}$ in order to extract mainly the DC and low frequency components. For example, voltages $V_A$ and $V_{PD}$ are observed while capacitor $C_{PD}$ is adjusted until voltage $V_{PD}$ acceptably follows the peak of voltage $V_A$-$V_{GSN1}$. When transitioning from a low voltage to a high voltage, voltages $V_A$ and $V_{PD}$ rise together. Voltage $V_{PD}$, when transitioning from a high voltage to a low voltage, however, does not fall as fast as voltage $V_A$ because of the lower frequency f2 compared to the higher frequency f1. At the same time voltage $V_{PD}$ is pulled high again by the low to high transition of voltage $V_A$ in the next cycle. Furthermore, voltage $V_A$ oscillates having some voltage portions higher than the threshold voltage of transistor N1 (e.g., threshold $V_{THN1}$) and some voltage portions lower than threshold $V_{THN1}$. Transistor N1 turns on when voltage $V_A$ is higher than threshold $V_{THN1}$ and turns off when voltage $V_A$ is lower than threshold $V_{THN1}$. During the time transistor N1 turns on, the current provided by voltage $V_A$ (at the gate of transistor N1) to the source of transistor N1 (e.g., voltage $V_{PD}$) charges capacitor $C_{PD}$ to the peak (or to substantially the peak) of voltage $V_A$–$V_{GSN1}$. During the time transistor N1 turns off there is no significant charge changes with regard to $C_{PD}$. As a result, voltage $V_{PD}$ reflects the peak of voltage $V_A$ (subject to the $V_{GSN1}$ drop).

Figure 3:
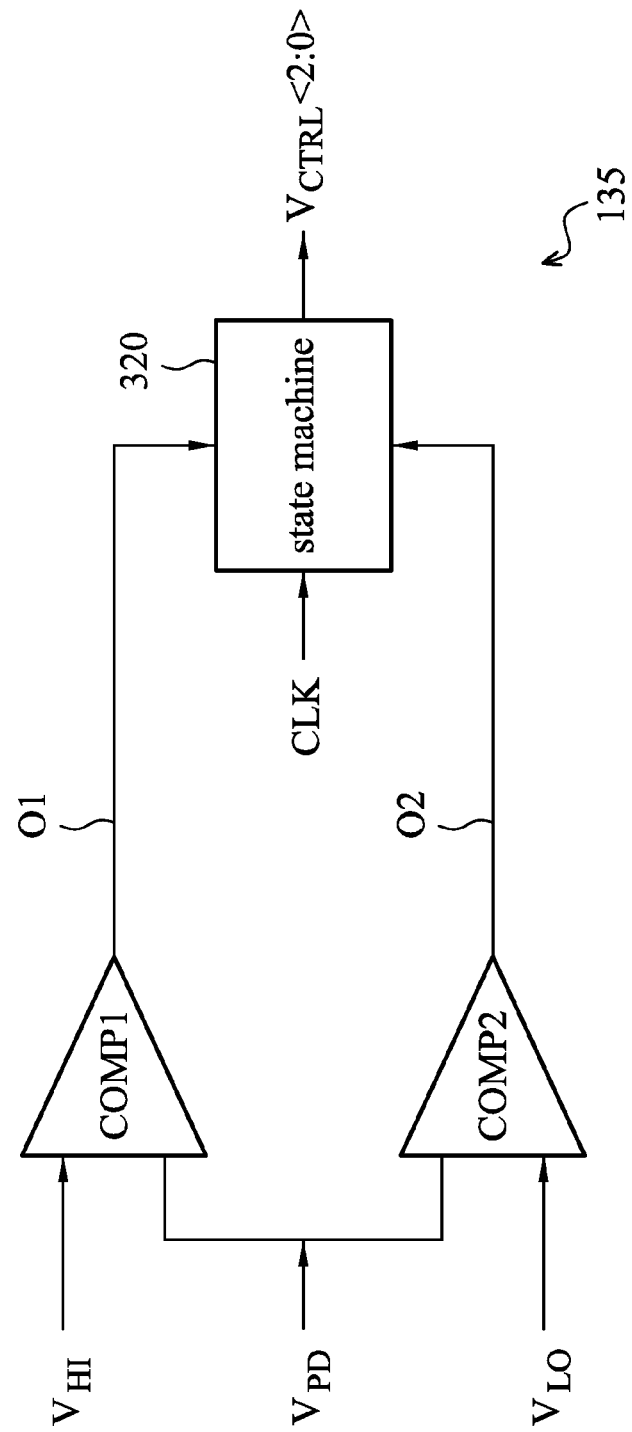
FIG. 3 is a detailed schematic diagram of the calibrator of the MEMS circuit in FIG. 1, in accordance with some embodiments.

FIG. 3 is a schematic diagram of calibrator 135, in accordance with some embodiments.

In some embodiments, state machine 320 includes 8 states corresponding to the 8 digital values decoded by 3 bits of signal $V_{CTRL}$. For example, the 8 digital values of signal $V_{CTRL}$ include 000, 001, 010, 011, 100, 101, and 111 that correspond to the 8 states of state machine 320, also for example being 000, 001, 010, 011, 100, 101, and 111.

Voltages $V_{HI}$ and $V_{LO}$ serve as reference voltages. If voltage $V_{PD}$ is in between voltages $V_{LO}$ and $V_{HI}$, comparators COMP1 and COMP2 generate signals O1 and O2 for state machine 320 to remain at the same state. But if voltage $V_{PD}$ is higher than voltage $V_{HI}$, comparator COMP1 generates signal O1 such that state machine 320 changes to another state so that voltage $V_{PD}$ decreases. If voltage $V_{PD}$, however, is lower than voltage $V_{LO}$, comparator COMP2 generates signal O2 such that state machine 320 changes to another state so that voltage $V_{PD}$ increases. For example, the current state of state machine 320 before the comparison of $V_{PD}$ to voltages $V_{HI}$ and $V_{LO}$ is 010. If voltages $V_{PD}$ is in between $V_{LO}$ and $V_{HI}$, comparators COMP1 and COMP2 generate signals O1 and O2 such that state machine 320 remains at the same state 010. But if voltage $V_{PD}$ is higher than voltage $V_{HI}$, comparator COMP1 generates signal O1 such that state machine 320 changes to state 001, which corresponds to a decrease of voltage $V_{PD}$. If voltage $V_{PD}$, however, is lower than voltage $V_{LO}$, comparator COMP2 generates signal O2 such that state machine 320 changes to state 011, which corresponds to an increase of voltage $V_{PD}$.

Clock CLK provides a clock signal for state machine 320. In some embodiments, clock CLK is derived from a system clock using circuit 100 that has a frequency much faster than the frequency used by state machine 320. As a result, the system clock is divided (e.g., by a value M) to generate clock CLK.

Figure 4:
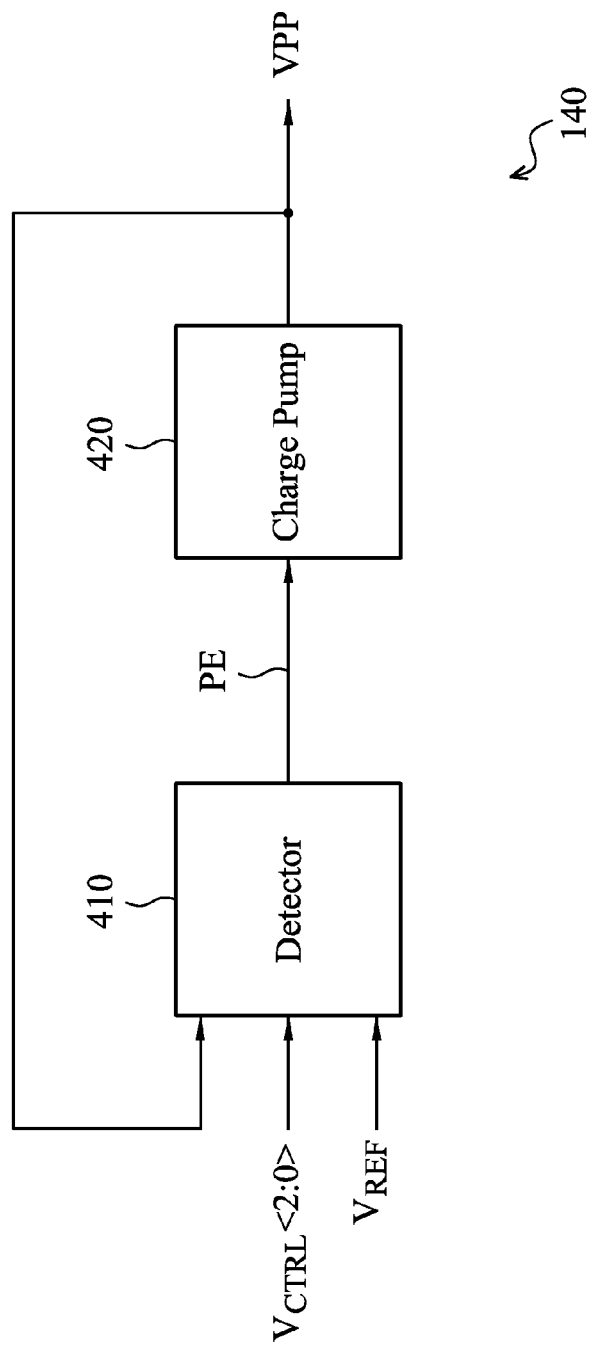
FIG. 4 is a detailed functional block diagram of the charge pump regulator of the MEMS circuit in FIG. 1, in accordance with some embodiments.

FIG. 4 is a schematic diagram of charge pump regulator 140 in accordance with some embodiments.

In some embodiments, three control bits $V_{CTRL}$<2:0> correspond to 8 digital values that in turn correspond to 8 states of state machine 320. Each digital value (or state of state machine 320) corresponds to a reference voltage generated by voltage $V_{REF}$. The eight states of state machine 320, for example, correspond to the eight reference voltages $V_{REF1}$ to $V_{REF8}$. Detector 410 based on the digital value generated by $V_{CTRL}$<2:0> compares voltage VPP to the corresponding reference voltage (e.g., $V_{REF1}$). If voltage VPP is higher than voltage $V_{REF1}$, detector 410 deactivates pump enable signal PE so that charge pump 420 stops pumping (e.g., stops increasing voltage VPP). But if voltage VPP is lower than voltage $V_{REF1}$, detector 410 activates signal PE so that charge pump 420 continues to pump (e.g., increase voltage VPP).

In the above illustration, the 3-bit signal $V_{CTRL}$ corresponding to 8 digital codes, 8 states of state machine 320, and 8 reference voltages $V_{REF1}$ to $V_{REF8}$ is used for illustration. The different number of bits for signal $V_{CTRL}$ and thus the different number of digital codes, the different number of states for state machine 320 and the different number of reference voltages are within the scope of the disclosed embodiments.

Illustration Waveforms

Figure 5:
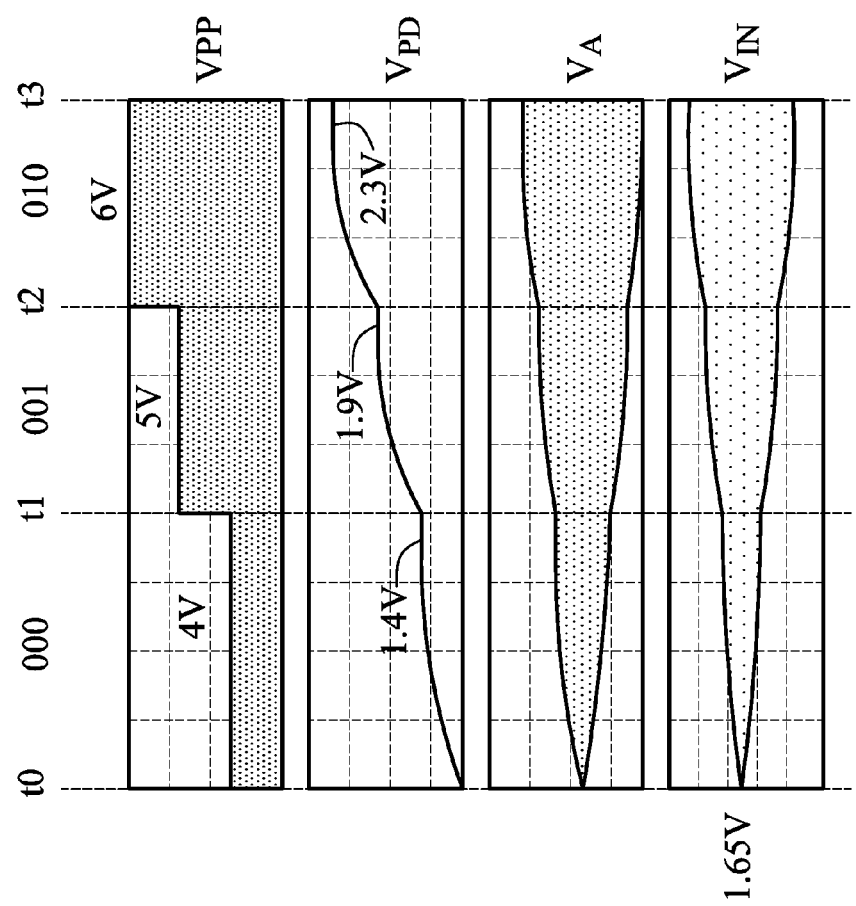
FIG. 5 is a graph of waveforms illustrating various signals of the MEMS circuit in FIG. 1, in accordance with some embodiments.

FIG. 5 is a graph of waveforms illustrating various signals for circuit 100 in operation, in accordance with some embodiments. The horizontal axis represents the time unit, while the vertical axes represent the voltages for the corresponding signals $V_{IV}$, $V_A$, $V_{PD}$, and VPP. Signals $V_{IV}$ and $V_A$ are sinusoidal, but for amplitude illustrations, the sinusoidal details are not shown. Signal $V_{PD}$ is the peak of signal $V_A$. The shape of voltage $V_A$ is similar to that of voltage $V_{HDV}$, except that voltage $V_{HDV}$ has a higher amplitude corresponding to the gain of amplifier 120. Waveforms depicted in FIG. 5 are not shown to scale.

In the example of signal $V_{CTRL}$<2:0> having 3 bits, there are 8 corresponding digital values 000, 001, 010, 011, 010, 011, 100, 101, and 111, which correspond to 8 states e.g., 000, 001, 010, 011, 010, 011, 100, 101, and 111 of state machine 320. Further, states 000, 001, 010, 011, 010, 011, 100, 101, and 111 correspond to the respective voltages VPP and thus respective reference voltages (e.g., $V_{REF1}$ to $V_{REF8}$) at 4V, 5V, 6V, 7V, 8V, 9V, 10V, and 11V. For illustration, however, only three values or states 000, 001, and, 010 are shown. Further, MEMS oscillator 125 demands the energy to move proof mass 125-1 a distance of 10 μm that corresponds to voltage VPP at 6V. These design details discussed in the disclosure are merely exemplary and not intended to be limiting.

Prior to time t0, voltage VPP is at 0V, and, because voltage $V_{AREF}$ is set at 1.65V, voltage $V_{IV}$ is at 1.65V. The signal behaviors starting at each time t0, t1, and t2 are similar in which the signal first increases and then remains at a constant level after some time. The voltage increase corresponds to the speed increase of proof mass 125-1 and the current increase of current Iosc. The voltage constant corresponds to the constant speed/current.

At time t0, the system using circuit 100 is reset. State machine 320 is default to state 000 in which charge pump 420 generates a default 4V for voltage VPP. Proof mass 125-1 receives a voltage of 4V starts moving. Current Iosc starts increasing corresponding to the increase of voltages $V_{IV}$, $V_A$ and $V_{PD}$, and settles at its peak corresponding to voltage $V_{PD}$ at about 1.4V.

At time t1, voltage $V_{PD}$ at 1.4V is compared with voltages $V_{HI}$ and $V_{LO}$, which are at 2.0V and 2.5V, respectively, for example. Because voltage $V_{PD}$ at 1.4V is lower than voltage $V_{LO}$ at 2.0V, comparators COMP1 and COMP2 generate signals O1 and O2 for state machine 320 to change from state 000 to state 001. Charge pump 420, having state 001 as an input, generates 5V for voltage VPP. Proof mass 125-1, receiving a change of voltage VPP (or $V_{HDV}$) from 4V to 5V starts increasing its speed. Current Iosc then increases, causing voltage $V_{PD}$ to increase and saturate at 1.9V.

At time t2, voltage $V_{PD}$ at 1.9V is compared with voltages $V_{HI}$ and $V_{LO}$. Because voltage $V_{PD}$ at 1.9V is lower than voltage $V_{LO}$ at 2.0V, comparators COMP1 and COMP2 generate signals O1 and O2 for state machine 320 to change to state 010. Charge pump 420, corresponding to state 010, generates 6V for voltage VPP. Proof mass 125-1, receiving a change of voltage from 5V to 6V starts increasing its speed. Current Iosc then increases, causing voltage $V_{PD}$ to increase and saturate at 2.3V.

At time t3, voltage $V_{PD}$ at 2.3V is compared with voltages $V_{HI}$ and $V_{LO}$. Because voltage $V_{PD}$ at 2.3V is between voltage $V_{LO}$ at 2.0V and voltage $V_{HI}$ at 2.5V, comparators COMP1 and COMP2 generate signals O1 and O2 for state machine 320 to remain at state 010.

Figure 6:
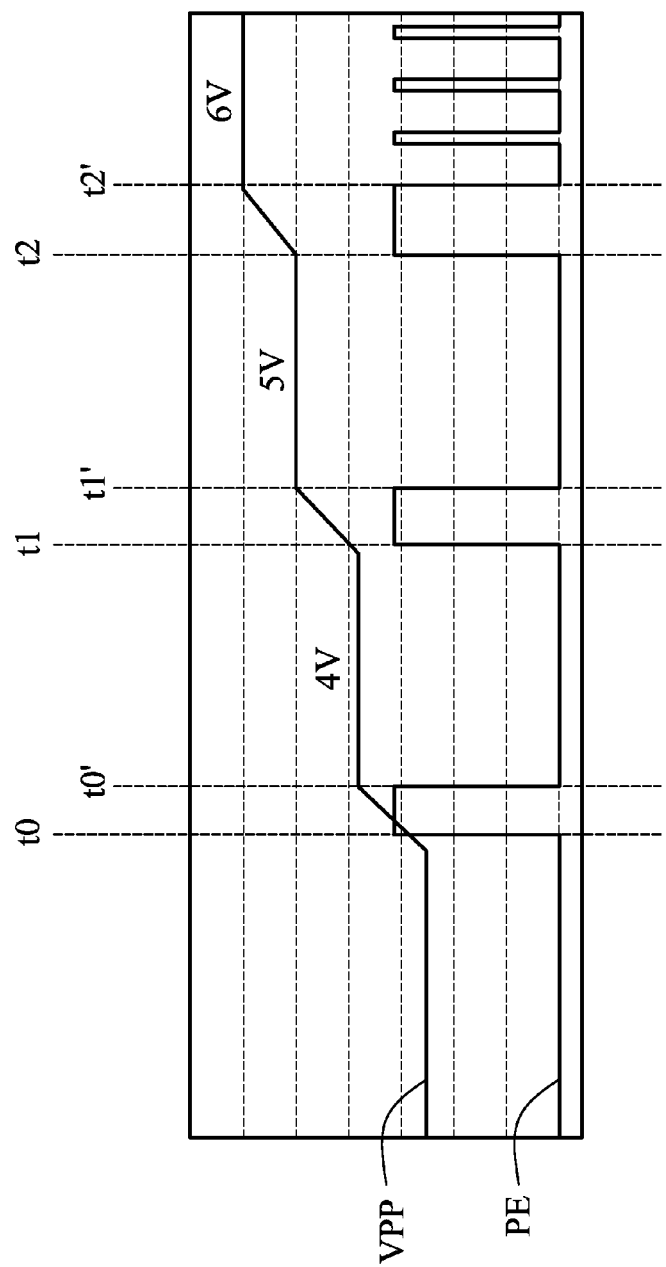
FIG. 6 is a graph of waveforms illustrating the operation of the pump enable signal with respect to signal VPP, in accordance with some embodiments.

FIG. 6 is a graph of waveforms 600 illustrating the operation of pump enable signal PE with respect to voltage VPP. Times t0, t1, and t2 are the same as times t0, t1, and t2 in FIG. 5. The time scale in FIG. 6, however, is at a higher resolution than that of FIG. 5. In this illustration, at the beginning of each time t0, t1, and t2, voltage VPP takes time to reach 4V, 5V, and 6V respectively, and is illustrated as the time periods between times t0 and t0', t1 and t1', and t2 and t2'. Because of the low resolutions these time periods were not shown in FIG. 5. Alternatively stated, these time periods are relatively small in FIG. 5. In FIG. 6, during these time periods, because voltage VPP is not yet at the desired voltages of 4V, 5V, and 6V, detector 410 keeps generating a high pump enable signal PE for charge pump 420 to continue pumping (e.g., increases voltage VPP). Once voltage VPP reaches the desired voltages 4V, 5V, and 6V, detector 410 generates a low pump enable signal PE for charge pump 420 to stop pumping.

For further illustration, assuming for example, after time t2', voltage VPP drops below 6V three times, corresponding to the three high pulses of signal PE, indicating charge pump 420 is enabled to pump voltage VPP to (above) 6V.

Exemplary Method

Figure 7:
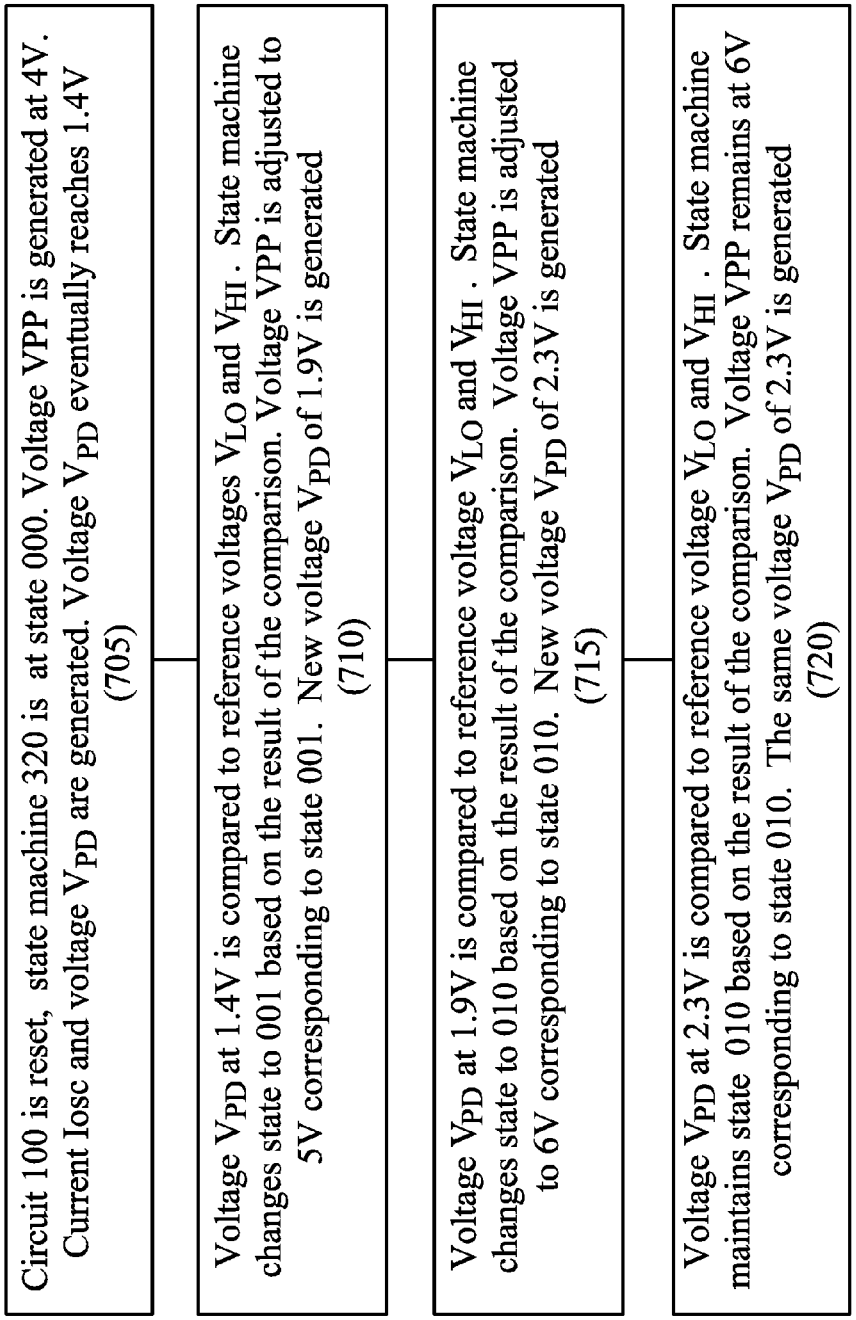
FIG. 7 is a flowchart illustrating a method related to the circuit of FIG. 1, in accordance with some embodiments.

FIG. 7 is a flowchart 700 illustrating an operation of circuit 100, in accordance with some embodiments.

In step 705, current Iosc and voltage $V_{PD}$ are generated. For example, circuit 100 is reset to a default condition wherein state machine 320 is default to state 000. Detector 410 compares voltage VPP at 0V to $V_{REF1}$ corresponding to state 000 at 4V and generates enable signal PE for charge pump 420 to pump voltage VPP to 4V. Before voltage VPP reaches 4V, detector 410 keeps generating a high pump enable signal PE for charge pump 420 to continue pumping voltage VPP to 4V. In some embodiments, voltage VPP takes a few nanoseconds to reach to 4V. Proof mass 125-1 receiving the 4V from voltage VPP (or voltage $V_{HDV}$) starts moving. As a result, current Iosc is generated and starts increasing, corresponding to voltage $V_{PD}$ being generated and increased. Voltage $V_{PD}$ eventually reaches 1.4V a few milliseconds later.

In step 710, voltage VPP is adjusted. Initially, calibrator 135 compares voltage $V_{PD}$ at 1.4V to voltages $V_{LO}$ and $V_{HI}$, which are set at 2.0V and 2.5V, respectively. Because voltage $V_{PD}$ at 1.4V is lower than voltage $V_{LO}$, calibrator 135 changes state machine 320 from state 000 to state 001 corresponding to signal $V_{CTRL}$ at 001. Detector 410 compares voltage VPP at 4.0 to voltage $V_{REF2}$ corresponding to state 001 at 5V and generates enable signal PE for charge pump 420 to pump voltage VPP to 5V. Proof mass 125-1 receiving the voltage change of $V_{HDV}$ (or VPP) from 4V to 5V starts moving faster. Current Iosc starts increasing, corresponding to voltage $V_{PD}$ increasing. Voltage $V_{PD}$ eventually reaches 1.9V a few milliseconds later.

In step 715, calibrator 135 compares voltage $V_{PD}$ at 1.9V to voltages $V_{LO}$ and $V_{HI}$, which are set at 2.0V and 2.5V. Because voltage $V_{PD}$ at 1.9V is lower than voltage $V_{LO}$, calibrator 135 changes state machine 320 from state 001 to state 010 corresponding to signal $V_{CTRL}$ at 010. Detector 410 compares voltage VPP at 5V to voltage $V_{REF3}$ corresponding to state 010 at 6V and generates enable signal PE for charge pump 420 to pump voltage VPP to 6V. Proof mass 125-1 receiving the voltage change of voltage VPP from 5V to 6V starts moving faster. Current Iosc starts increasing, corresponding to voltage $V_{PD}$ increasing. Voltage $V_{PD}$ eventually reaches 2.3V a few milliseconds later.

In step 720, calibrator 135 compares voltage $V_{PD}$ at 2.3V to voltages $V_{LO}$ and $V_{HI}$, which are set at 2.0V and 2.5V. Because voltage $V_{PD}$ at 2.3V is in between voltage $V_{LO}$ and voltage $V_{HI}$ state machine 320 remains at the same state 010 corresponding to signal $V_{CTRL}$ at 010. Detector 410 compares voltage VPP at 6V to voltage $V_{REF3}$ corresponding to state 010 at 6V and disables signal PE for charge pump 420 to stop pumping voltage VPP at 6V. Proof mass 125-1 receiving voltage VPP at 6V keeps moving at the same speed. Current Iosc remains the same, corresponding to the same voltage $V_{PD}$ at 2.3V.

In step 710, voltage $V_{PD}$ is lower than voltage $V_{LO}$ for illustration. But if voltage $V_{PD}$ is higher than voltage $V_{HI}$ then signal $V_{CTRL}$ is generated such that charge pump CP changes its state machine towards a lower voltage VPP until voltage $V_{PD}$ is in between voltages $V_{HI}$ and $V_{LO}$.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of the embodiments. The logic level (e.g., low or high) of the various signals used in the above description is also for illustration purposes, the embodiments are not limited to a particular level when a signal is activated and/or deactivated, but, rather, selecting such a level is a matter of design choice.

The above method embodiments show exemplary steps, but they are not necessarily performed in the order shown. Steps may be added, replaced, changed order, and/or eliminated as appropriate, in accordance with the spirit and scope of disclosed embodiments. For example, the exemplary method illustrates state machine 320 changes such that voltage VPP increases (e.g., from state 000 to state 001, and to state 010) because voltage $V_{PD}$ is less than voltage $V_{LO}$, but state machine 320 can change in a reverse direction (e.g., from state 101 to 100 to 011, etc.) such that voltage VPP decreases, e.g., if voltage $V_{PD}$ is greater than voltage $V_{HI}$.

Each claim of this document constitutes a separate embodiment, and embodiments that combine different claims and/or different embodiments are within scope of the disclosure and will be apparent to those of ordinary skill in the art after reviewing this disclosure.

What is claimed is:

1. A method for controlling a MEMS device, comprising:
    generating a current according to a movement of the MEMS device; the movement is controlled by a control signal;
    converting the current to a voltage signal;
    amplifying the voltage signal;
    generating a peak voltage according to the amplified voltage signal; and
    adjusting the control signal during a period that the peak voltage is out of a predetermined range, the predetermined range ranging from a first reference voltage to a second reference voltage.

2. The method of claim 1 further comprising using the control signal as an operation voltage for a driver driving a proof mass of the MEMS device.

3. The method of claim 2 wherein generating the current is performed when the proof mass moves.

4. The method of claim 1 wherein adjusting the control signal comprises generating a state of a state machine and comparing the control signal with a third reference voltage corresponding to the state of the state machine.

5. The method of claim 1 wherein generating the peak voltage comprises:
    using the amplified voltage signal to control a first transistor coupled to a capacitive device, resulting in the amplified voltage signal running at a first frequency higher than a second frequency running by the peak voltage; and repeating steps of charging the capacitive device via the first transistor when the amplified voltage signal turns on the transistor and stop charging the capacitive device when the amplified voltage signal turns off the transistor.

6. The method of claim 1 wherein generating the peak voltage comprises:
driving the amplified voltage signal to a gate of a first transistor; and
at a source of the first transistor,
coupling the source of the first transistor to a first end of a capacitive device; and
providing a current path at the source of the first transistor.

7. A MEMS circuit comprising:
a MEMS oscillator configured to generate a current;
a current-to-voltage converter configured to convert the current to a first voltage;
an amplifier configured to convert the first voltage to a second voltage;
a voltage peak detector configured to generate a voltage peak of the second voltage;
a calibrating circuit configured to receive the voltage peak and generate a calibrating circuit signal;
a voltage generating circuit configured to generate a third voltage based on the calibrating circuit signal; and
a driver configured to receive the second voltage as an input and the third voltage as an operation voltage and generate a fourth voltage for use by the MEMS oscillator.

8. The MEMS circuit of claim 7 wherein the MEMS oscillator comprises a proof mass that generates the current when the fourth voltage causes the proof mass to move.

9. The MEMS circuit of claim 7 wherein the voltage peak detector comprises
a first transistor having a first gate, first drain, and a first source;
a second transistor having a second gate, a second drain, and a second source; and
a capacitive device having a first capacitive end and a second capacitive end;
wherein
the first gate is configured to receive the second voltage;
the first source is coupled to the first capacitive end and the second drain and to generate the voltage peak; and
the second capacitive end is coupled to the second source and a bulk of the second transistor.

10. The MEMS circuit of claim 7 further comprising:
a switching device configured to be at a first state based on first voltage portions of the second voltage and to be at a second state based on second voltage portions of the second voltage; and
a capacitive device coupled to the switching device configured to be charged by a current generated from the first voltage portions.

11. The MEMS circuit of claim 7 wherein
the calibrating circuit comprises a comparator and a state machine; and
the comparator is configured based on the voltage peak, a first reference voltage, and a second reference voltage to generate the calibrating circuit signal corresponding to a state of the state machine that corresponds to a voltage level of the third voltage.

12. The MEMS circuit of claim 7 wherein
the voltage generating circuit comprises a detector and a charge pump;

the detector is configured to control the charge pump based on the calibrating circuit signal, a voltage reference corresponding to a state of a state machine of the calibrating circuit, and a voltage level of the third voltage.

13. The MEMS circuit of claim 12 wherein the detector is configured to control the charge pump by generating an enable signal based on the calibrating circuit signal, the reference voltage and the voltage level of the third voltage.

14. A circuit comprising:
a node having a first voltage;
a voltage peak detector coupled to the first node and configured to generate a voltage peak of the first voltage;
a comparator configured to generate a compare-result signal based on the voltage peak, a first reference voltage, and a second reference voltage;
a state machine configured to generate a state machine signal based on the compare-result signal;
a voltage generating circuit configured to generate a second voltage based on the state machine signal, a voltage level of the second voltage, and a third reference voltage; and
a driver coupled to the first node and configured to receive the first voltage as an input and the second voltage as an operation voltage and generate a third voltage for use by an oscillating circuit; a voltage level of the first voltage corresponding to a voltage level of the third voltage via a feedback loop.

15. The circuit of claim 14 wherein the feedback loop comprises a current path having a current converted to the first voltage.

16. The circuit of claim 14 wherein the feedback loop comprises
a current path having a current;
a current-to-voltage converter configured to convert the current to a converted voltage; and
an amplifier configured to amplify the converted voltage to the first voltage.

17. The circuit of claim 14 wherein the state machine includes a plurality of states; a state of the plurality of states corresponding to the voltage level of the second voltage.

18. The circuit of claim 14 wherein the voltage peak detector comprises
a first transistor having a first gate, first drain, and a first source;
a second transistor having a second gate, a second drain, and a second source;
a capacitive device having a first capacitive end and a second capacitive end;
wherein
the first gate is configured to receive the second voltage;
the first source is coupled to the first capacitive end and the second drain, and to generate the voltage peak;
the second capacitive end is coupled to the second source and a bulk of the second transistor.

19. The circuit of claim 14 further comprising:
a switching device configured to be at a first state based on first voltage portions of the second voltage and to be at a second state based on second voltage portions of the second voltage; and
a capacitive device coupled to the switching device configured to be charged by a current generated from the first voltage portions.

* * * * *